United States Patent
Hosoda et al.

(10) Patent No.: US 7,341,393 B2
(45) Date of Patent: Mar. 11, 2008

(54) MECHANISM FOR SEALING

(75) Inventors: Masaki Hosoda, Saitama (JP); Masato Muraki, Inagi (JP); Yasuhiro Someda, Utsunomiya (JP); Mahito Negishi, Tachikawa (JP); Koichi Wakizaka, Kawasaki (JP); Masakazu Sugaya, Inagi (JP)

(73) Assignees: Canon Kabushiki Kaisha, Tokyo (JP); Hitachi High-Technologies Corp., Tokyo (JP)

( * ) Notice: Subject to any disclaimer, the term of this patent is extended or adjusted under 35 U.S.C. 154(b) by 298 days.

(21) Appl. No.: 11/155,633

(22) Filed: Jun. 20, 2005

(65) Prior Publication Data

US 2006/0006342 A1    Jan. 12, 2006

(30) Foreign Application Priority Data

Jun. 30, 2004   (JP) .............................. 2004-194772

(51) Int. Cl.
   *F16C 11/00*   (2006.01)
   *F16D 1/12*    (2006.01)
(52) U.S. Cl. ................ 403/132; 250/492.2; 250/441.11
(58) Field of Classification Search ................ 250/281, 250/396 R; 313/251, 292; 445/33; 359/811, 359/819
   See application file for complete search history.

(56) References Cited

U.S. PATENT DOCUMENTS 2,481,357 A * 9/1949 Smith et al. .................. 52/394
6,281,508 B1   8/2001 Lee et al.
6,872,950 B2 * 3/2005 Shimada et al. ......... 250/396 R
7,173,262 B2 * 2/2007 Hosoda et al. ......... 250/492.22

* cited by examiner

Primary Examiner—Jack Berman
Assistant Examiner—Meenakshi S Sahu
(74) Attorney, Agent, or Firm—Fitzpatrick, Cella, Harper & Scinto

(57) ABSTRACT

A mechanism for connecting first and second members through a sealing member sandwiched therebetween includes a position adjustment portion which adjusts a position of the first member in a direction substantially perpendicular to a surface of the second member with respect to the sealing member arranged on the second member, a reference portion which is provided to the second member and has a reference surface substantially perpendicular to the surface of the second member, and a pressing portion which presses the first member in a direction substantially parallel to the surface of the second member against the reference surface of the reference portion. A positioning member is provided to the first member and comes into contact with the reference surface of the reference portion, with the positioning member being position-adjustable with respect to a reference position of the first member. The first member, while being separated from the sealing member by the position adjustment portion, is positioned by the reference portion and pressing portion in the direction substantially parallel to the surface of the second member, and is thereafter moved by the position adjustment portion in the direction substantially perpendicular to the surface of the second member to deform the sealing member.

12 Claims, 13 Drawing Sheets

MECHANISM FOR SEALING

FIELD OF THE INVENTION

The present invention relates to a mechanism for sealing and, more particularly, to a mechanism and method which connect the first and second members through a sealing member sandwiched between them, an assembly which has the first and second members arranged to sandwich a sealing member between them, a charged particle beam exposure apparatus, and a device manufacturing method. The present invention is suitable to a component in, e.g., an evaluation apparatus or manufacturing apparatus such as a vapor deposition apparatus or exposure apparatus, or a method of manufacturing the component.

BACKGROUND OF THE INVENTION

In a charged particle beam exposure apparatus having a plurality of lenses or lens barrels, as a structure which aligns the lenses arranged at multiple stages, one proposed in U.S. Pat. No. 6,281,508 is available. According to this structure, alignment apertures are formed in the plurality of lenses, and a positioning rod is extended through the openings to adjust the positions of the lenses. The diameters of the positioning apertures and the diameter of the positioning rod are adjusted to be almost equal. Therefore, the positions of the lenses arranged at the multiple stages can be adjusted with high positioning accuracy.

U.S. Pat. No. 6,281,508, however, does not refer to position adjustment among members that are in contact with a vacuum sealing member.

It is very difficult to adjust the position of a charged particle beam source, an electrostatic lens, an electrode which forms an electrostatic lens, a magnetic field lens, a magnetic pole which forms a magnetic field lens, a deflector, an electron detector, a lens barrel, or another vacuum member with high positioning accuracy, because a vacuum sealing member which is arranged between members to be position-adjusted deforms.

SUMMARY OF THE INVENTION

It is an object of the present invention to position the first and second members with high accuracy through a sealing member sandwiched between them.

According to the first aspect of the present invention, there is provided a mechanism for connecting first and second members through a sealing member sandwiched therebetween, comprising a position adjustment portion which adjusts a position of the first member in a direction substantially perpendicular to a surface of the second member with respect to the sealing member arranged on the second member, a reference portion which is provided to the second member and has a reference surface substantially perpendicular to the surface of the second member, and a pressing portion which presses the first member in a direction substantially parallel to the surface of the second member against the reference surface of the reference portion, wherein the first member, while being separated from the sealing member by the position adjustment portion, is positioned by the reference portion and pressing portion in the direction substantially parallel to the surface of the second member, and is thereafter moved by the position adjustment portion in the direction substantially perpendicular to the surface of the second member to deform the sealing member.

According to a preferred embodiment of the present invention, preferably, the mechanism can further comprise a positioning member which is provided to the first member and comes into contact with the reference surface of the reference portion, and the positioning member is position-adjustable with respect to a reference position of the first member.

According to another preferred embodiment of the present invention, preferably, the mechanism further comprises a detecting unit which detects contact between the positioning member and the reference surface of the reference portion.

According to still another preferred embodiment of the present invention, preferably, while the first member is positioned with respect to the reference surface, the reference portion allows the first member to slide in the direction substantially perpendicular to the surface of the second member.

According to still another preferred embodiment of the present invention, preferably, the position adjustment portion separates the first member from the sealing member by an elastic member provided between the first and second members, so as to bring the first member into contact with the sealing member by a load applied to the first member.

According to still another preferred embodiment of the present invention, preferably, the position adjustment portion causes a gas to flow out from a gas flow-out portion provided to the first member toward the second member so as to separate the first member from the sealing member, and stops outflow of the gas from the gas flow-out portion to bring the first member into contact with the sealing member.

According to still another preferred embodiment of the present invention, preferably, the mechanism further comprises a position detecting unit which detects positions relative to each other of a first mark formed on the first member and a second mark formed on the second member.

According to still another preferred embodiment of the present invention, preferably, the mechanism can further comprise a fixing portion which connects the first and second members, and the fixing portion comprises a screw having a coefficient of friction not more than 0.04, or a two-stage screw.

According to the second aspect of the present invention, there is provided a method of connecting first and second members through a sealing member sandwiched therebetween, comprising a first step of arranging the first member to be spaced apart from the sealing member arranged on the second member, a second step of pressing the first member against a reference surface of a reference portion provided to the second member, so as to position the first member with respect to the second member in a direction substantially parallel to a surface of the second member, and a third step of moving the first member in a direction substantially perpendicular to the surface of the second member to deform the sealing member.

According to the third aspect of the present invention, there is provided an assembly having first and second members arranged through a sealing member sandwiched therebetween, wherein the second member has a reference portion having a reference surface, the assembly comprises a pressing portion which presses the first member against the reference surface in a direction substantially parallel to a surface of the second member, and the second member is fixed to the first member while the first member abuts against the reference surface and the sealing member is compressed between the first and second members.

According to still another preferred embodiment of the present invention, preferably, the second member has a groove to hold the sealing member.

According to still another preferred embodiment of the present invention, preferably, a sectional area of the sealing member is 80% (inclusive) to 100% (exclusive) a sectional area of the groove.

According to still another preferred embodiment of the present invention, preferably, the groove has a side wall which forms an angle of 0° (exclusive) to 20° (inclusive) in a direction substantially perpendicular to the surface of the second member.

According to still another preferred embodiment of the present invention, preferably, the sealing member contains an elastic material or plastic material.

According to still another preferred embodiment of the present invention, preferably, a coefficient of friction of the sealing member is not more than 1.7.

According to still another preferred embodiment of the present invention, preferably, Shore hardness of the elastic material is HS40 (inclusive) to HS100 (inclusive).

According to still another preferred embodiment of the present invention, preferably, Shore hardness of the plastic material is not less than Shore hardness of copper.

According to the fourth aspect of the present invention, there is provided a charged particle beam exposure apparatus which forms a pattern on an object using a charged particle beam, comprising a charged particle beam source and the assembly described above, the assembly comprising a deflector which defects the charged particle beam.

According to the fifth aspect of the present invention, there is provided a device manufacturing method comprising a step of exposing an object using the charged particle beam exposure apparatus described above, and a step of developing the exposed object.

According to the present invention, for example, the first and second members are positioned at high accuracy through the sealing member sandwiched between them.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The first embodiment shows an example of a mechanism which connects two members. The second embodiment shows an example of an electron beam exposure apparatus having a multi-stage structure in which a plurality of members are connected. The third embodiment shows an example of an electron beam exposure apparatus having a structure in which a plurality of members are arranged on one member.

The member or substrate to be used in the following embodiment can form, e.g., a charged particle beam source, an electrostatic lens, an electrode which forms an electrostatic lens, a magnetic field lens, a magnetic pole which forms a magnetic field lens, a deflector, or an electron detector. Positional adjustment among members or substrates relative to each other will be described hereinafter.

First Embodiment (Mechanism Which Connects Two Members)

A mechanism which connects two members will be described as the first embodiment of the present invention.

Figure 1:
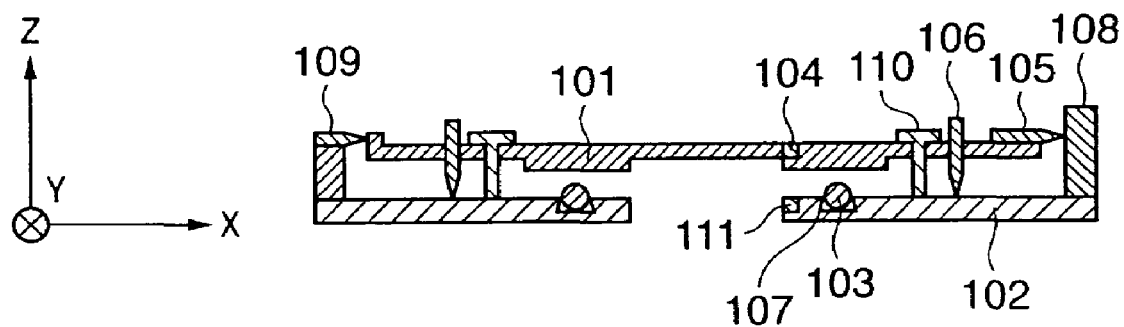
FIG. 1 is a schematic sectional view, seen from the side, of a mechanism according to the first embodiment of the present invention which connects two members.
Figure 2:
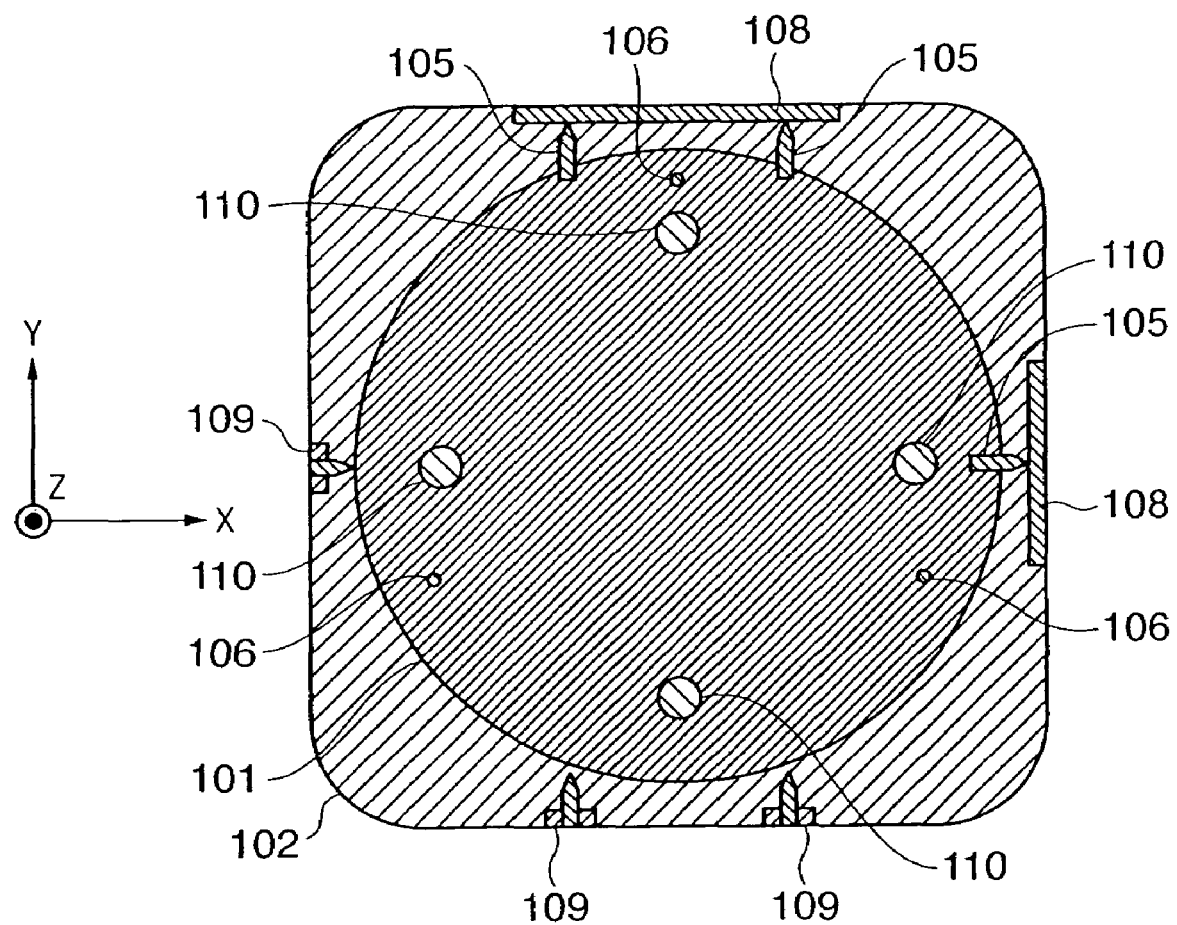
FIG. 2 is a schematic plan view, seen from above, of the mechanism according to the first embodiment of the present invention which connects the two members.

FIGS. 1 and 2 are schematic views, respectively seen from the side and above, of the main part of a mechanism which connects two members. For example, this mechanism is suitable for the manufacture of a vacuum device.

As shown in FIG. 1, a device 101 serving as the first substrate (first member) is arranged above a base 102 serving as the second substrate (second member). The device 101 and base 102 are sealed using a vacuum sealing member (sealing member) 103. As the material of the vacuum sealing member 103, specifically, an elastic material (Viton or silicone) or plastic material (metal gasket) is suitable. Assume that silicone is used to form the vacuum sealing member 103. When the vacuum sealing member and first substrate come into contact with ach other, the lower the coefficient of friction of the vacuum sealing member, the smaller the force that the vacuum seal material applies to the first substrate in a direction parallel to the surface of the first substrate, and a positional shift does not occur easily. When a metal gasket is used as the vacuum sealing member 103, as the metal gasket is a plastic material, the force that the vacuum seal material applies to the first substrate in the direction parallel to the surface of the first substrate becomes substantially zero, and a positional shift does not occur easily.

As shown in FIG. 1, the device 101 includes a position detecting mark 104 and at least one positioning portion 105. The positional relationship of the positioning portion 105 and the position detecting mark 104 can be adjusted by moving the positioning portion 105 in an X-Y plane. The distal end of the positioning portion 105 forms, e.g., a ball or a plane.

As shown in FIG. 2, for example, the positioning portion 105 is provided one in an X direction and two in a Y direction.

Figure 3A:
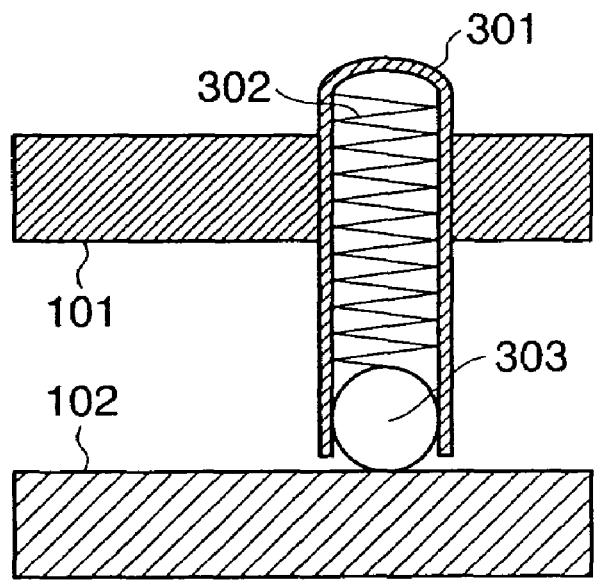
FIGS. 3A and 3B are views for explaining a levitating mechanism according to the first embodiment of the present invention.
Figure 3B:
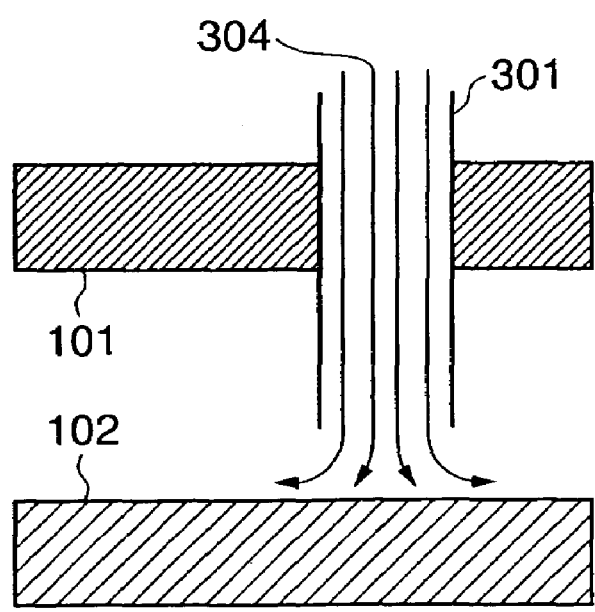

As shown in FIG. 1, the device 101 has at least one levitating mechanism (position adjustment portion) 106 which enables the device 101 to move in the X-Y plane such that the device 101 is not in contact with the vacuum sealing member 103. In the example shown in FIG. 2, the three levitating mechanisms 106 are provided in the X-Y plane. As shown in FIG. 3A, each levitating mechanism 106 can include, e.g., a cylinder 301, spring 302, and ball 303. Alternatively, as shown in FIG. 3B, each levitating mechanism 106 can include, e.g., a cylinder 301 and a supply unit (not shown) which supplies air 304 into the cylinder 301. The device 101 can be levitated above the base 102 by the force of the spring 302 or air 304. When the Z-direction position of the levitating mechanism 106 with respect to the device 101 is adjusted, the Z-direction position of the device 101 with respect to the base 102 can be adjusted. When the spring 302 is used as the levitating mechanism 106, the spring 302 can be compressed by placing a weight on the device 101 to bring the device 101 and vacuum sealing member 103 into contact with each other, so that the vacuum sealing member 103 can be compressed. When the air 304 is used as the levitating mechanism 106, the device 101 and vacuum sealing member 103 can be brought into contact with each other by stopping supply of the air 304 into the cylinder 301, so that the vacuum sealing member 103 can be compressed.

Figure 4:
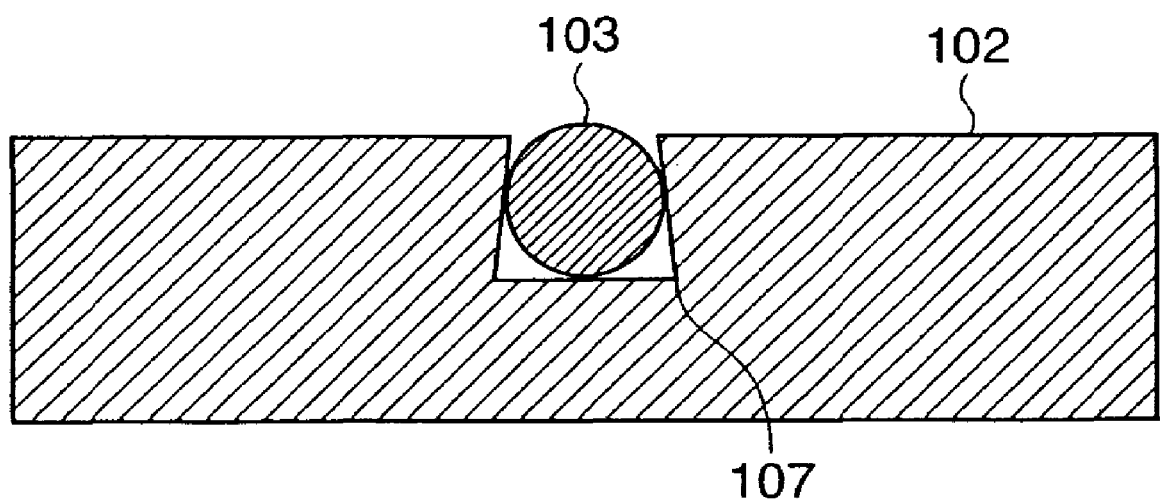
FIG. 4 is a view for explaining a groove for a vacuum sealing member according to the first embodiment of the present invention.

As shown in FIG. 1, the base 102 has a groove 107 which regulates the position, movement, and deformation amount of the vacuum sealing member 103. For example, the groove 107 can have a circular or polygonal shape on the X-Y plane. As shown in FIG. 4, the proportion of the sectional area of the vacuum sealing member 103 to the sectional area of the groove 107 is preferably 80% (inclusive) to 100% (exclusive), particularly 95% (inclusive) to 100% (exclusive). Furthermore, the side surface of the groove 107 preferably has an angle of 0° (exclusive) to 20° (inclusive) to regulate the position, movement, and deformation amount of the vacuum sealing member 103.

Figure 5:
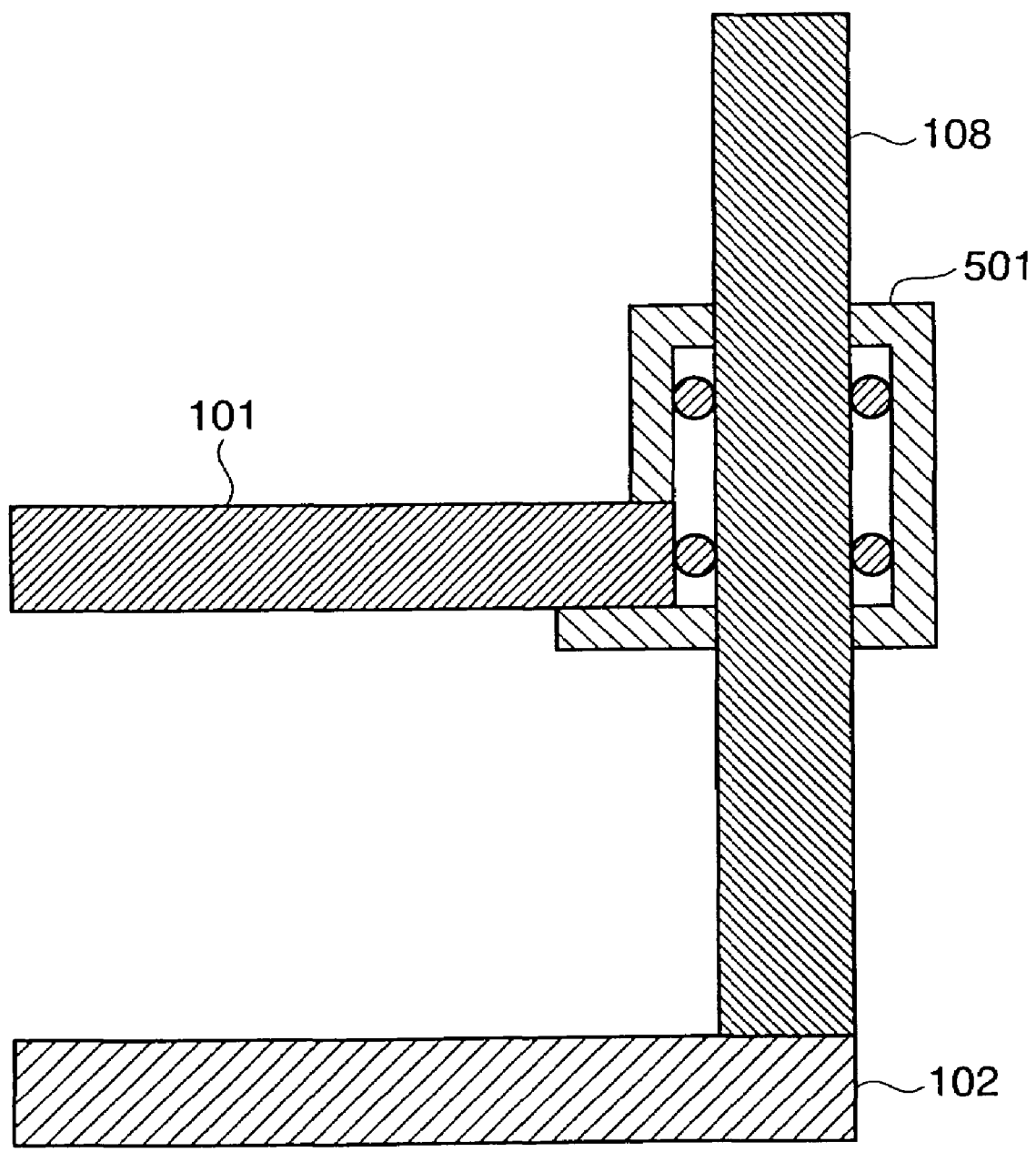
FIG. 5 is a view for explaining a guide according to the first embodiment of the present invention which allows slide.

As shown in FIG. 1, the base 102 has at least one reference plate (reference portion) 108 which has a reference surface perpendicular to the X-Y plane. The positional relationship of the reference plate 108 with respect to a position detecting mark 111 can be adjusted by moving the reference plate 108 within the X-Y plane. The reference plate 108 preferably has a guide 501 which slides in the Z direction, as shown in FIG. 5, or a smooth flat surface. In the example shown in FIG. 2, the reference plate 108 is provided one in each of the X and Y directions. The reference plates 108 are in contact with the corresponding positioning portions 105 at one portion in the X direction and two portions in the Y direction to regulate the position and rotation of the device 101 with respect to the base 102.

As shown in FIG. 1, the base 102 has pressing portions 109 which apply pressing forces to the device 101 in directions parallel to the X-Y plane. The pressing portions 109 are preferably formed such that their pressing forces are adjustable. As shown in FIG. 2, the points of action of the forces of the pressing portions 109 and the points of action of the forces of the positioning portions 105 are preferably symmetric about the center of the device 101. As shown in FIG. 2, the interval of the pressing portions 109 that are arranged in line is preferably equal to or lager than the interval of the positioning portions 105 to which the pressing portions 109 apply forces. For example, the distal ends of the pressing portions 109 are preferably spherical or flat. The pressing forces that the pressing portions 109 apply to the device 101 are less than the pressure that deforms the positioning portions 105 and reference plates 108 irreversibly and equal to or more than the pressure that can fix the position of the device 101.

Figure 6:
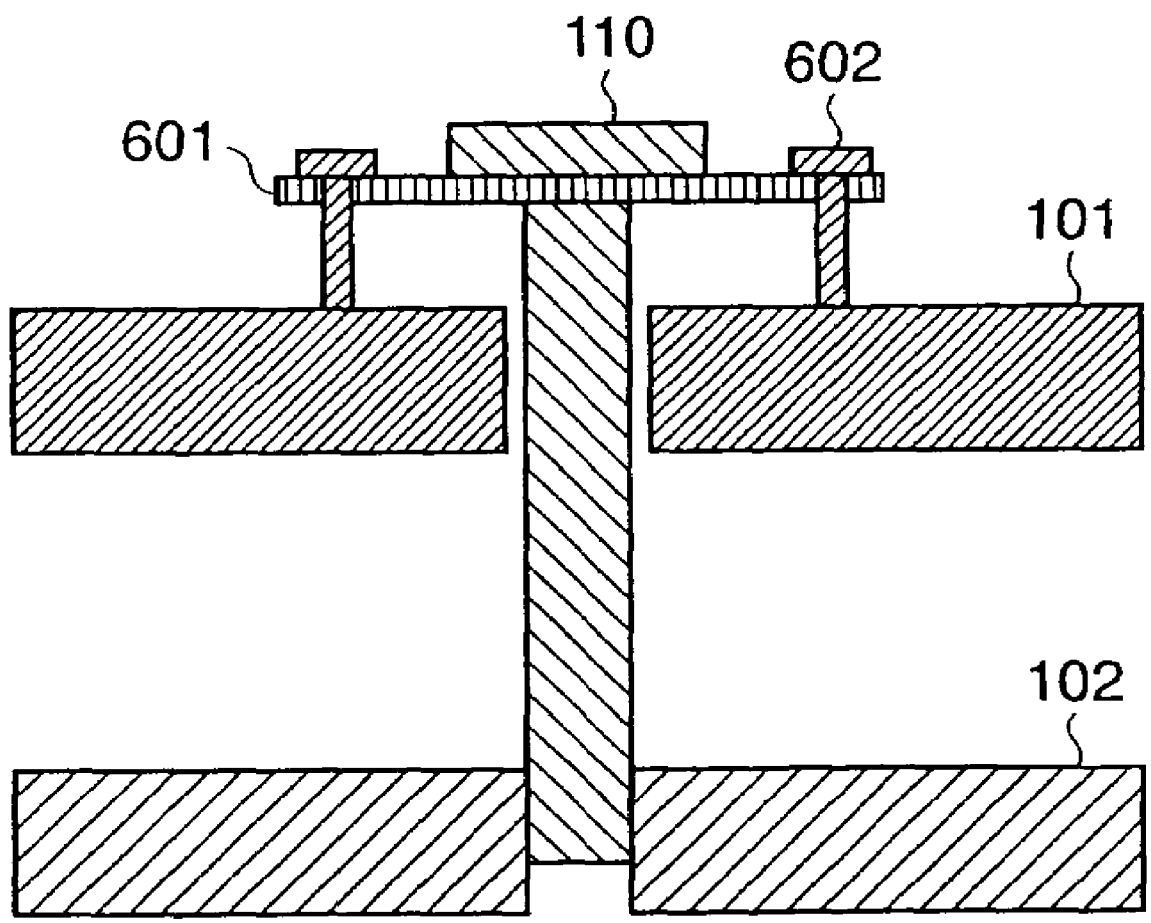
FIG. 6 is a view for explaining a two-stage screw according to the first embodiment of the present invention.

As shown in FIG. 1, at least one fixing component 110 is used to fix the device 101 and base 102. In the example shown in FIG. 2, the fixing components 110 fix the device 101 to the base 102 at two portions in the X direction and two portions in the Y direction, leading to a total of four portions. More specifically, each fixing component 110 is preferably a screw the coefficient of friction of which is 0.04 or less or a two-stage screw so the fixing component 110 itself does not rotate. The two-stage screw shown in FIG. 6 includes a plate 601 which fixes the fixing component 110 and screws 602 which generate fixing forces. The device 101 can be fixed to the base 102 without generating a rotational torque in the fixing component 110.

When a position measuring machine (position detection unit) (not shown) is used, the position detecting mark 104 and position detecting mark 111 shown in FIG. 1 are used for measuring the positions of the device 101 and base 102 relative to each other.

In the mechanism having the above structure, first, the device 101 is levitated above the base 102 by using the levitating mechanism 106. The device 101 is moved to bring the positioning portions 105 into contact with the reference plates 108. The position of the device 101 in the horizontal direction with respect to the base 102 is fixed by using the pressing portions 109. Thus, the device 101, while being fixed, can be moved in the Z direction within the X-Y plane which is perpendicular to the Z direction (compressing direction) along which the vacuum sealing member 103 is to be deformed to vacuum-seal the device 101 and base 102. At this time, the contact of the positioning portions 105 and reference plates 108 is judged if switches (detecting units) for detecting the contact are built into the positioning portions 105 and reference plates 108 or the positioning portions 105 and reference plates 108 are electrically insulated and the electrical resistances between them are measured.

After that, a weight is placed on the device 101 to compress the spring of the levitating mechanism 106, or air supply to the levitating mechanism 106 is stopped, to move the device 101 in the Z direction so as to come into contact with the vacuum sealing member 103. Then, the space surrounded by the device 101, base 102, and vacuum sealing member 103 is evacuated by an evacuating device. Thus, the position of the device 101 with respect to the base 102 can be determined at high accuracy while sealing the device 101 and base 102 by the vacuum sealing member 103 without accompanying deformation of the vacuum sealing member 103 in the X and Y directions.

Second Embodiment (Electron Beam Exposure Apparatus 1)

An electron beam exposure apparatus according to the second embodiment of the present invention will be described with reference to FIGS. 7 to 9.

Figure 7:
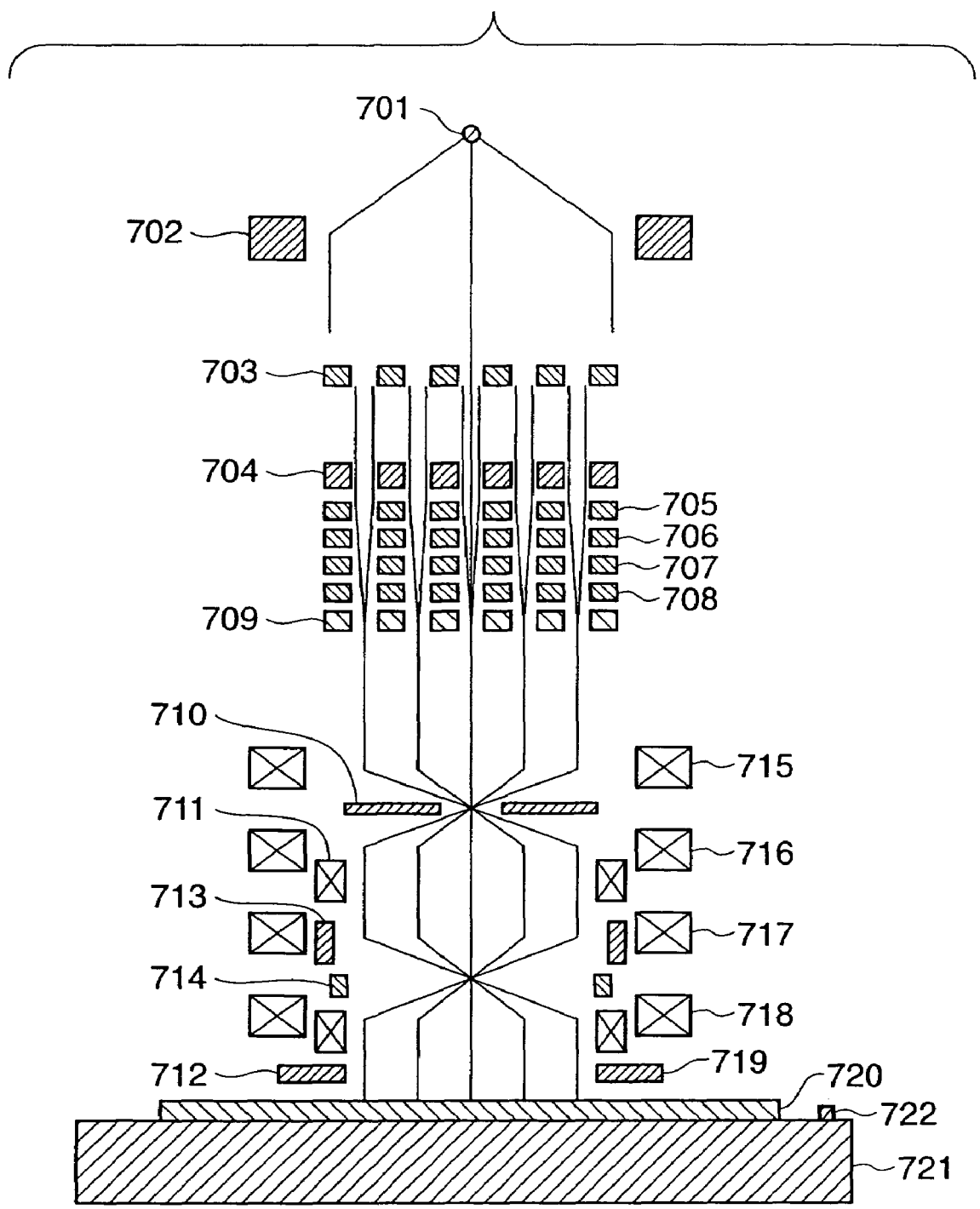
FIG. 7 is a view for schematically explaining the main part of a multibeam scheme electron beam exposure apparatus according to the second embodiment of the present invention.
Figure 8:
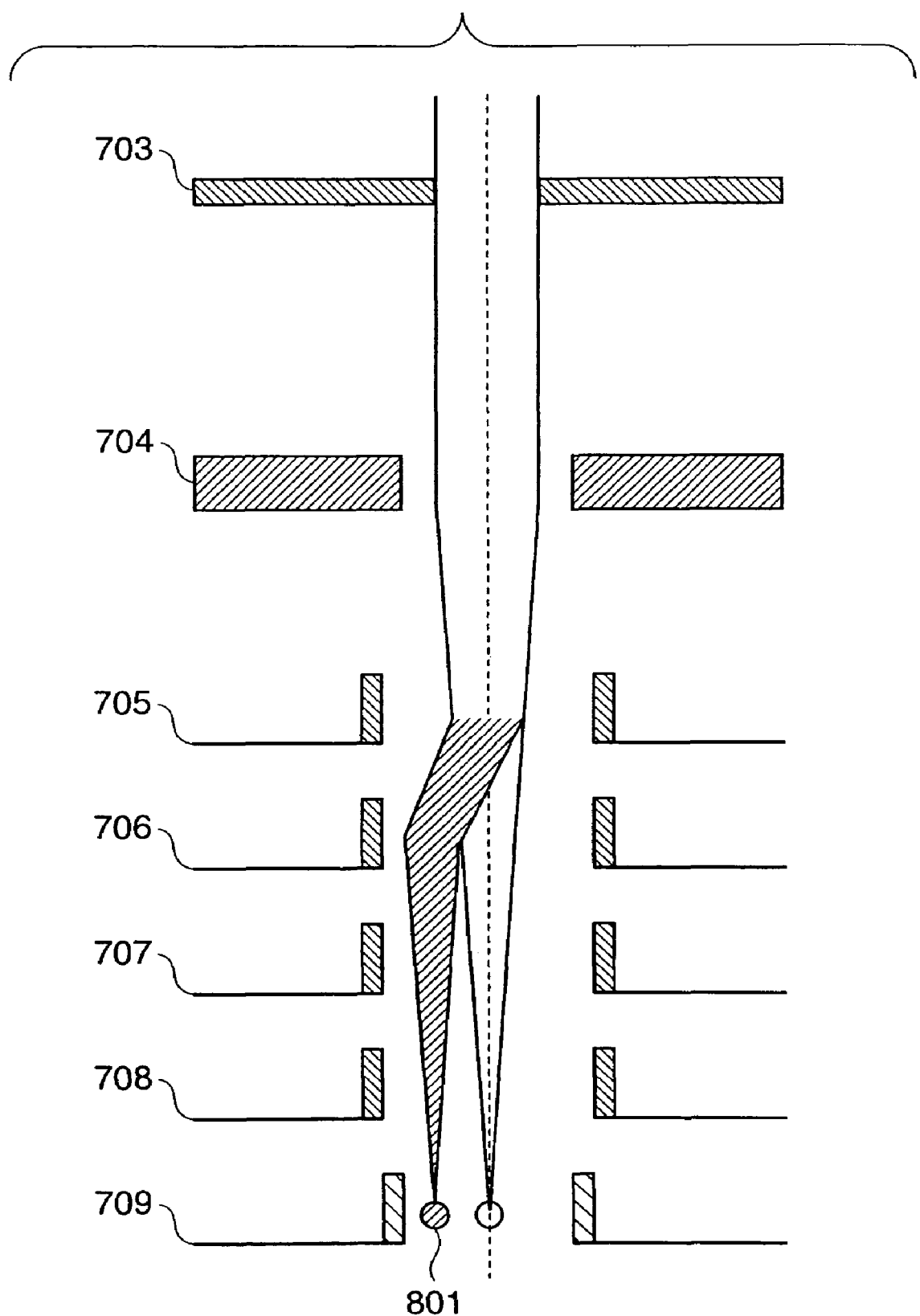
FIG. 8 is a view for explaining a multi-source module according to the second embodiment of the present invention.

FIG. 7 is a schematic view of the main part of a multibeam scheme electron beam exposure apparatus. The elements from an electron source 701 to a multi-deflector array 707 form a multi-source module which forms a plurality of electron source images and radiates electron beams from the electron source images. In the example shown in FIG. 7, the multi-source module is formed by two-dimensionally arranging a 5×5 module matrix. Reference numeral 701 denotes the electron source (crossover image) formed by an electron gun. The electron beam emitted from the electron source 701 is formed into a substantially parallel electron beam by a condenser lens 702. Reference numeral 703 denotes an aperture array having a two-dimensional aperture array, and reference numeral 704 denotes a lens array formed by two-dimensionally arranging electrostatic lenses having the same optical power. Reference numerals 705, 706, 707, and 708 denote multi-deflector arrays each formed by two-dimensionally arranging electrostatic 8-pole deflectors which can be driven separately. Reference numeral 709 denotes a blanker array formed by two-dimensionally arranging electrostatic blankers which can be driven separately.

The functions of the respective elements will be described with reference to FIG. 8. The substantially parallel electron beam from the condenser lens 702 (see FIG. 7) is split into a plurality of electron beams by the aperture array 703. The split electron beams form intermediate images 801 of the electron source on the blankers of the blanker array 709 through the electrostatic lenses of the lens array 704. At this time, the multi-deflector arrays 705, 706, 707, and 708 separately adjust the positions (the positions within a plane perpendicular to the optical axis) of the intermediate images of the electron source which are formed on the blanker array 709. The electron beams which are deflected by the blanker array 709 are shielded by a blanking aperture 710 shown in FIG. 7 and accordingly do not irradiate a wafer 720. The electron beams which are not deflected by the blanker array 709 are not shielded by the blanking aperture 710 shown in FIG. 7 and accordingly irradiate the wafer 720.

Referring back to FIG. 7, the plurality of intermediate images of the electron source which are formed by the multi-source module are projected onto the wafer 720 through a reduction projection system formed by magnetic field lenses 715, 716, 717, and 718.

When the plurality of intermediate images are to be projected onto the wafer 720, their focal points are adjusted by dynamic focus lenses (electrostatic or magnetic field lenses) 711 and 712. Reference numerals 713 and 714 denote a main deflector and sub-deflector, respectively, which deflect the electron beams to portions to be exposed. Reference numeral 719 denotes a reflection electron detector which measures the positions of the respective intermediate images of the electron source which are formed on the wafer 720.

Reference numeral 721 denotes a stage which moves the wafer; and 722, a mark which is used to detect the positions of the electron beams.

In the multibeam scheme electron beam exposure apparatus described above, the multi-deflector arrays 705 to 708 and blanker array 709 shown in FIG. 7 must be arranged at multiple stages with high accuracy because there are no spaces between the respective devices to arrange aligners which adjust the positions of the electron beams.

Figure 9:
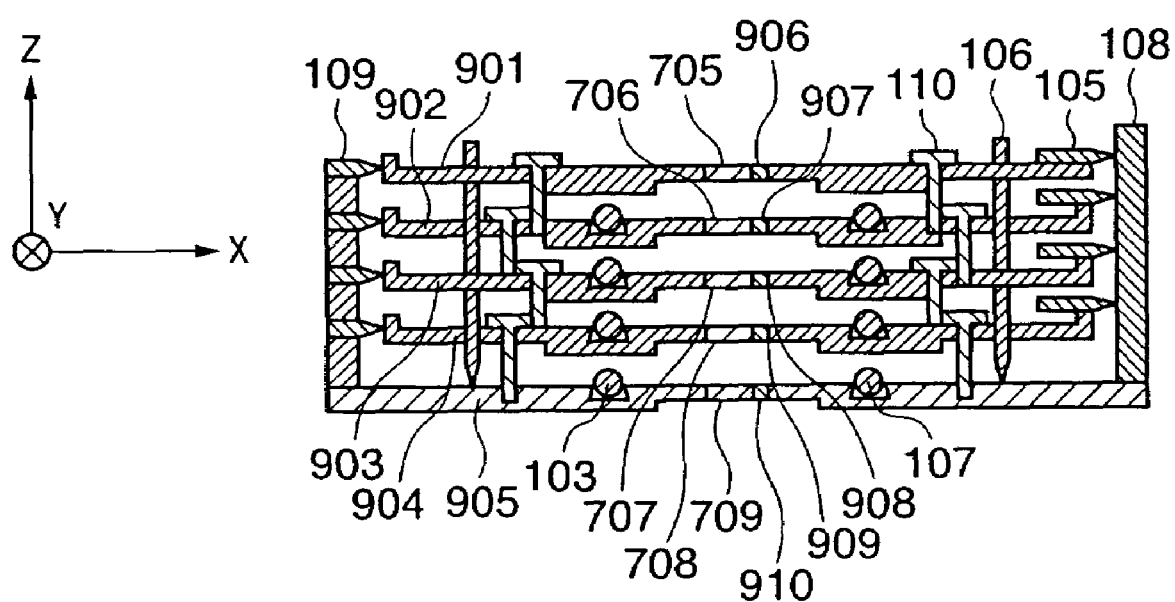
FIG. 9 is a schematic sectional view of a mechanism or assembly according to the second embodiment of the present invention which includes five members.
Figure 10A:
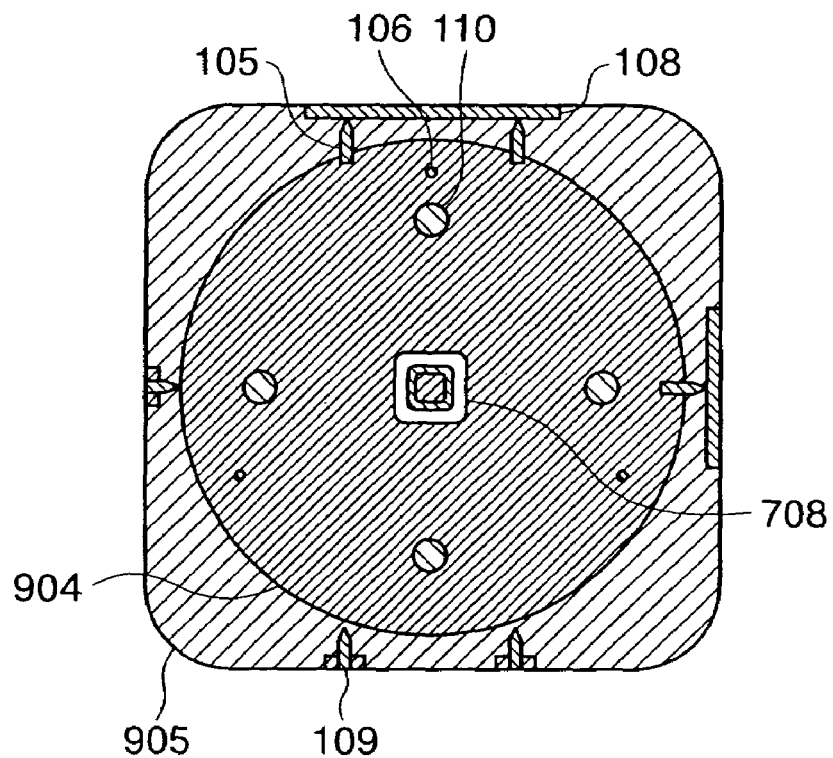
FIGS. 10A and 10B are schematic plan views, seen from above, of two out of the five members according to the second embodiment of the present invention.
Figure 10B:
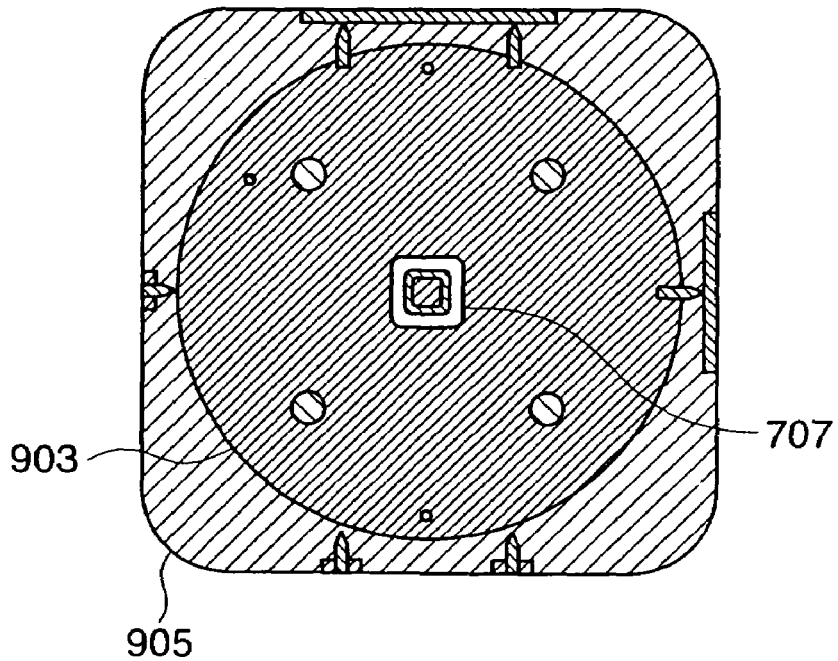

FIG. 9 is a schematic view of the main part, seen from the side, of a mechanism in which the multi-deflector arrays 705 to 708 and blanker array 709 of FIG. 7 are to be arranged at the multiple stages with high accuracy. To arrange a plurality of members at the multiple stages, a groove for a vacuum sealing member may be added in the upper stage of the device 101 shown in FIG. 1. Reference numerals 901, 902, 903, 904, and 905 shown in FIG. 9 denote base members where the multi-deflector arrays 705 to 708 and blanker array 709 serving as devices are mounted. The multi-deflector arrays 705 to 708 and blanker array 709 are respectively provided with position detecting marks 906 to 910. As shown in FIG. 10, the levitating mechanism 106 and fixing components 110 are positionally phase-shifted so they will not interfere with each other.

In the same manner as in the two-stage structure, the positions of the base members 902 to 905 with respect to the base member 901 are determined sequentially one stage by one stage by abutting positioning portions 105 to reference plates 108 and the base members 902 to 905 are fixed by using the fixing components 110, so that the positions of the multi-deflector arrays 705 to 708 with respect to the blanker array 709 can be determined at high accuracy. The positions of the aperture array 703, lens array 704, and blanker array 709 relative to each other can also be determined at high accuracy in the same manner.

Third Embodiment (Electron Beam Exposure Apparatus 2)

An electron beam exposure apparatus according to the third embodiment of the present invention will be described with reference to FIG. 11.

Figure 11:
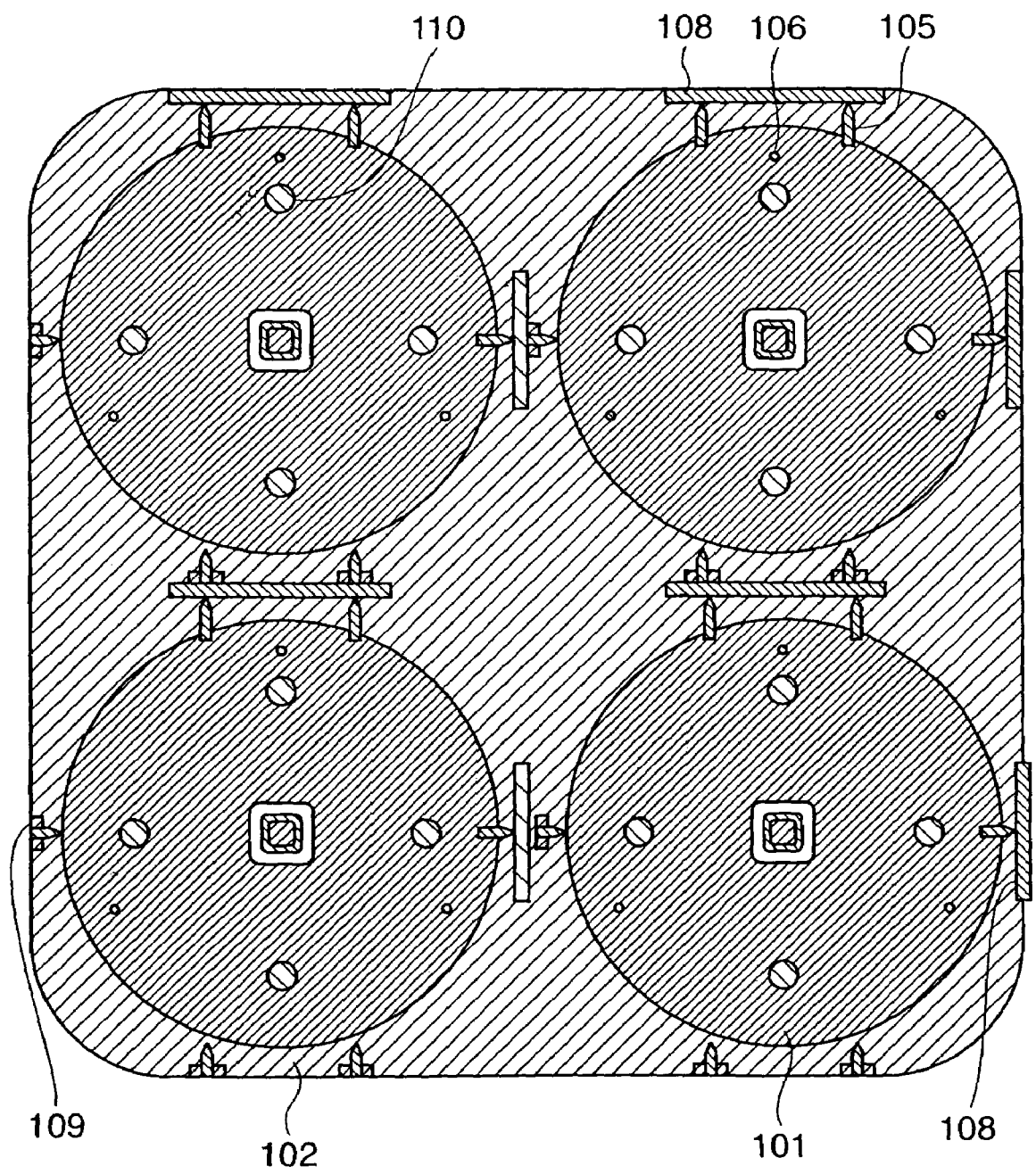
FIG. 11 is a schematic plan view of a mechanism or assembly according to the third embodiment of the present invention in which four members are arranged in a 2×2 matrix on one plane.

FIG. 11 is a main part schematic plan view, seen from above, of four members that are arranged in one plane in a multicolumn scheme in which multibeam scheme electron beam exposure apparatuses are arranged in a 2×2 matrix. To arrange a plurality of members in one plane, reference plates 108, each of which is similar to the reference plate 108 shown in FIG. 1, corresponding in number to the plurality of members may be arranged on a base 102. In this case as well, the positions of the members can be determined at high accuracy by sequentially determining the positions of the respective members and fixing the respective members.

Fourth Embodiment

<Assembling Method>

Figure 12:
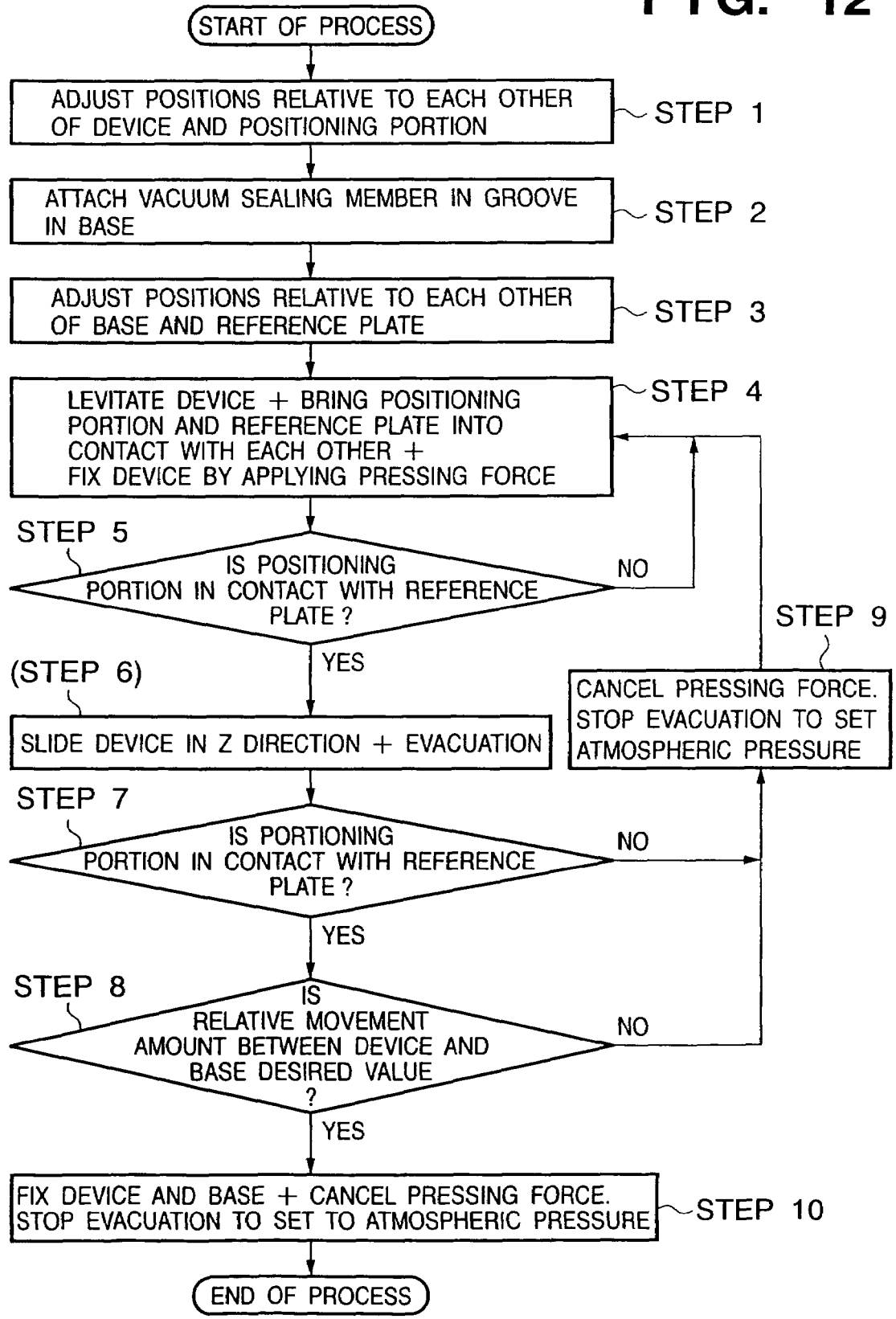
FIG. 12 is a flowchart for explaining a method of manufacturing an assembly by connecting two members according to the fourth embodiment of the present invention.

A method of manufacturing an assembly by connecting two members according to the fourth embodiment of the present invention will be described with reference to FIG. 12. To fix a device 101 at a desired position on a base 102 by using a vacuum sealing member 103, the following steps are performed.

In step 1, the positions relative to each other within an X-Y plane of a position detecting mark 104 provided to the device 101 and a positioning portion 105 provided to the device 101 are measured. The positioning portion 105 is moved in the X-Y plane to adjust the relative position of the positioning portion 105 with respect to the device 101 to a predetermined desired value.

In step 2, the vacuum sealing member 103 is attached in a groove 107 in the base 102.

In step 3, the positions relative to each other within the X-Y plane of a position detecting mark 111 provided to the base 102 and a reference plate 108 provided to the base 102 are measured. The reference plate 108 is moved in the X-Y plane to adjust the relative position of the reference plate 108 with respect to the base 102 to a predetermined desired value.

In step 4, the device 101 is levitated above the base 102 by using a levitating mechanism 106 so the device 101 does not come into contact with the base 102.

In this state, the device 101 is moved in the X-Y plane to bring the device 101 or the positioning portion 105 provided to the device 101 into contact with the base 102 or the reference plate 108 provided to the base 102 at a predetermined portion, so that the relative position of the device 101 with respect to the base 102 within the X-Y plane is determined.

After that, the device 101 is pressed against the base 102 by pressing portions 109 to fix the position of the device 101 within the X-Y plane.

In step 5, if the device 101 or the positioning portion 105 provided to the device 101 is in contact with the base 102 or the reference plate 108 provided to the base 102 at the predetermined portion, the flow advances to step 6. If NO, the flow returns to step 4.

In step 6, a weight is placed on the device 101 or the levitating mechanism 106 is released to move the device 101 in the Z direction while maintaining the positional relationship between the device 101 and base 102 in the X-Y plane, to bring the device 101 into contact with the vacuum sealing member 103.

As a method of moving the device 101 in the Z direction while maintaining the positions of the device 101 and base 102 relative to each other within the X-Y plane, a method of sliding the positioning portion 105 with respect to the reference plate 108 which has a smooth surface, or a method which uses a slider or linear guide is suitable.

After that, by using a vacuum pump, a pressure using outer air is applied to the device 101 to move the device 101 in the Z direction while maintaining the positional relationship between the device 101 and base 102 within the X-Y plane. Thus, the vacuum sealing member 103 is deformed to seal the device 101 and base 102 by the vacuum sealing member 103. To deform the vacuum sealing member 103, alternatively, a weight may be placed on the device 101.

In step 7, if the device 101 or the positioning portion 105 provided to the device 101 is in contact with the base 102 or the reference plate 108 provided to the base 102 at the predetermined position, the flow advances to step 8. If NO, the flow advances to step 9.

In step 8, the relative moving amount between the device 101 and base 102 is measured by using the position detecting marks 104 and 111. If the relative moving amount between the device 101 and base 102 is a desired value, the flow advances to step 10. If NO, the flow advances to step 9.

In step 9, the force along the X-Y plane which is applied to the device 101 by the pressing portions 109 and the force which is applied in the Z direction by evacuation or the like are canceled. Alternatively, the levitating mechanism 106 may be activated.

In step 10, the device 101 and base 102 are fixed by using a fixing component 110.

After that, the force within the X-Y plane which is applied to the device 101 by the pressing portions 109 and the force which is applied in the Z direction by evacuation are canceled.

Steps 1 to 10 are repeated to connect a plurality of members at high positioning accuracy. Also, the plurality of members can be arranged within one plane.

Fifth Embodiment

Figure 13:
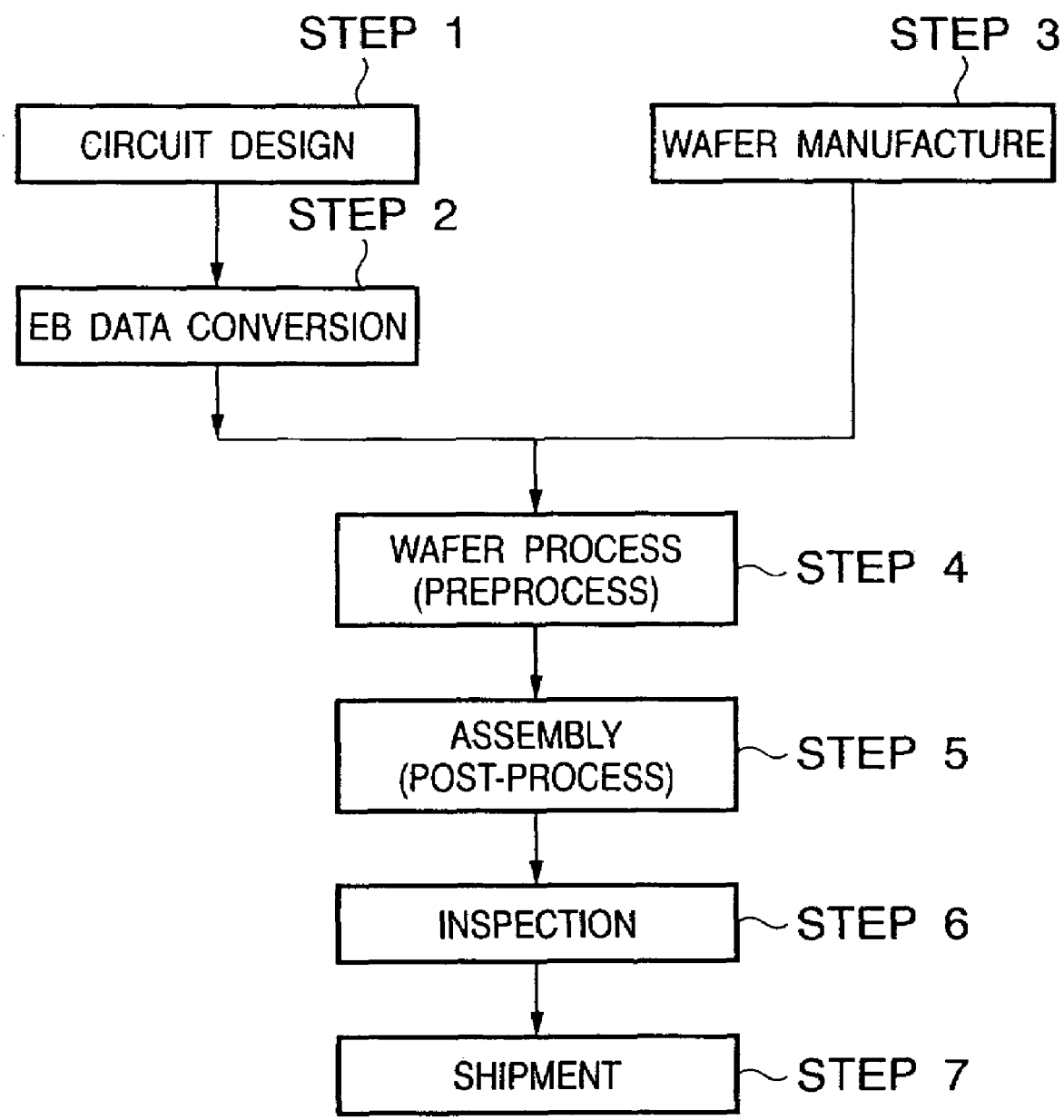
FIG. 13 is a flowchart showing the flow of an entire semiconductor device manufacturing process.

A semiconductor device manufacturing process which uses an exposure apparatus according to an above embodiment will be described. FIG. 13 is a flowchart showing the entire semiconductor device manufacturing process. In step 1 (circuit design), the circuit of a semiconductor device is designed. In step 2 (EB data conversion), exposure control data for the exposure apparatus is created on the basis of the designed circuit pattern.

In step 3 (wafer manufacture), a wafer is manufactured using a material such as silicon. In step 4 (wafer process) called a preprocess, an actual circuit is formed on the wafer in accordance with lithography using the wafer and the exposure apparatus to which the above exposure control data has been input. In the next step 5 (assembly) called a post-process, a semiconductor chip is formed from the wafer fabricated in step 4. This step includes assembly processes such as assembly (dicing and bonding) and packaging (chip encapsulation). In step 6 (inspection), inspections such as operation check test and durability test of the semiconductor device fabricated in step 5 are performed. A semiconductor device is finished with these steps and shipped in step 7.

The wafer process of step 4 has the following steps, i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of printing the circuit pattern to the wafer after the resist process step and exposing the wafer by using the exposure apparatus described above, a developing step of developing the wafer exposed in the exposure step, an etching step of removing portions other than the resist image developed in the developing step, and a resist removal step of removing any unnecessary resist after etching. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-194772 filed on Jun. 30, 2004, the entire contents of which are hereby incorporated by reference herein.

What is claimed is:

1. A mechanism for connecting first and second members through a sealing member sandwiched therebetween, comprising:

a position adjustment portion which adjusts a position of said first member in a direction substantially perpendicular to a surface of said second member with respect to said sealing member arranged on said second member;

a reference portion which is provided to said second member and has a reference surface substantially perpendicular to the surface of said second member;

a pressing portion which presses said first member in a direction substantially parallel to the surface of said second member against the reference surface of said reference portion; and a positioning member which is provided to said first member and comes into contact with the reference surface of said reference portion, said positioning member being position-adjustable with respect to a reference position of said first member, wherein said first member, while being separated from said sealing member by said position adjustment portion, is positioned by said reference portion and pressing portion in the direction substantially parallel to the surface of said second member, and is thereafter moved by said position adjustment portion in the direction substantially perpendicular to the surface of said second member to deform said sealing member.

2. The mechanism according to claim 1, further comprising a detecting unit which detects contact between said positioning member and the reference surface of said reference portion.

3. A mechanism for connecting first and second members through a sealing member sandwiched therebetween, comprising:

a position adjustment portion which adjusts a position of said first member in a direction substantially perpendicular to a surface of said second member with respect to said sealing member arranged on said second member;

a reference portion which is provided to said second member and has a reference surface substantially perpendicular to the surface of said second member; and a pressing portion which presses said first member in a direction substantially parallel to the surface of said second member against the reference surface of said reference portion, wherein said first member, while being separated from said sealing member by said position adjustment portion, is positioned by said reference portion and pressing portion in the direction substantially parallel to the surface of said second member, and is thereafter moved by said position adjustment portion in the direction substantially perpendicular to the surface of said second member to deform said sealing member, and said position adjustment portion separates said first member from said sealing member by an elastic member provided between said first and second members, so as to bring said first member into contact with said sealing member by a load applied to said first member.

4. A mechanism for connecting first and second members through a sealing member sandwiched therebetween, comprising:

a position adjustment portion which adjusts a position of said first member in a direction substantially perpendicular to a surface of said second member with respect to said sealing member arranged on said second member;

a reference portion which is provided to said second member and has a reference surface substantially perpendicular to the surface of said second member; and a pressing portion which presses said first member in a direction substantially parallel to the surface of said second member against the reference surface of said reference portion, wherein said first member, while being separated from said sealing member by said position adjustment portion, is positioned by said reference portion and pressing portion in the direction substantially parallel to the surface of said second member, and is thereafter moved by said position adjustment portion in the direction substantially perpendicular to the surface of said second member to deform said sealing member, and said position adjustment portion causes a gas to flow out from a gas flow-out portion provided to said first member toward said second member so as to separate said first member from said sealing member, and stops outflow of the gas from said gas flow-out portion to bring said first member into contact with said sealing member.

5. A mechanism for connecting first and second members through a sealing member sandwiched therebetween, comprising:

a position adjustment portion which adjusts a position of said first member in a direction substantially perpendicular to a surface of said second member with respect to said sealing member arranged on said second member;

a reference portion which is provided to said second member and has a reference surface substantially perpendicular to the surface of said second member;

a pressing portion which presses said first member in a direction substantially parallel to the surface of said second member against the reference surface of said reference portion; and a position detecting unit which detects positions relative to each other of a first mark formed on said first member and a second mark formed on said second member, wherein said first member, while being separated from said sealing member by said position adjustment portion, is positioned by said reference portion and pressing portion in the direction substantially parallel to the surface of said second member, and is thereafter moved by said position adjustment portion in the direction substantially perpendicular to the surface of said second member to deform said sealing member.

6. A mechanism for connecting first and second members through a sealing member sandwiched therebetween, comprising:

a position adjustment portion which adjusts a position of said first member in a direction substantially perpendicular to a surface of said second member with respect to said sealing member arranged on said second member;

a reference portion which is provided to said second member and has a reference surface substantially perpendicular to the surface of said second member;

a pressing portion which presses said first member in a direction substantially parallel to the surface of said second member against the reference surface of said reference portion; and a fixing portion which connects said first and second members, said fixing portion comprising a screw having a coefficient of friction not more than 0.04, or a two-stage screw, wherein said first member, while being separated from said sealing member by said position adjustment portion, is positioned by said reference portion and pressing portion in the direction substantially parallel to the surface of said second member, and is thereafter moved by said position adjustment portion in the direction substantially perpendicular to the surface of said second member to deform said sealing member.

7. An assembly having first and second members arranged through a sealing member sandwiched therebetween, wherein
- said second member has a reference portion having a reference surface,
- the assembly comprises a pressing portion which presses said first member against the reference surface in a direction substantially parallel to a surface of said second member,
- said second member is fixed to said first member while said first member abuts against the reference surface and said sealing member is compressed between said first and second members, and
- said second member has a groove to hold said sealing member.

8. The assembly according to claim 7, wherein a sectional area of said sealing member is 80% (inclusive) to 100% (exclusive) a sectional area of the groove.

9. The assembly according to claim 7, wherein the groove has a side wall which forms an angle of 0° (exclusive) to 20° (inclusive) in a direction substantially perpendicular to the surface of said second member.

10. An assembly having first and second members arranged through a sealing member sandwiched therebetween, wherein
- said second member has a reference portion having a reference surface,
- the assembly comprises a pressing portion which presses said first member against the reference surface in a direction substantially parallel to a surface of said second member,
- said second member is fixed to said first member while said first member abuts against the reference surface and said sealing member is compressed between said first and second members, and
- a coefficient of friction of said sealing member is not more than 1.7.

11. An assembly having first and second members arranged through a sealing member sandwiched therebetween, wherein
- said second member has a reference portion having a reference surface,
- the assembly comprises a pressing portion which presses said first member against the reference surface in a direction substantially parallel to a surface of said second member,
- said second member is fixed to said first member while said first member abuts against the reference surface and said sealing member is compressed between said first and second members,
- said sealing member contains an elastic material or plastic material, and
- a Shore hardness of said elastic material is HS40 (inclusive) to HS100 (inclusive).

12. An assembly having first and second members arranged through a sealing member sandwiched therebetween, wherein
- said second member has a reference portion having a reference surface,
- the assembly comprises a pressing portion which presses said first member against the reference surface in a direction substantially parallel to a surface of said second member;
- said second member is fixed to said first member while said first member abuts against the reference surface and said sealing member is compressed between said first and second members,
- said sealing member contains an elastic material or plastic material, and
- a Shore hardness of said plastic material is not less than a Shore hardness of copper.

* * * * *